(12) United States Patent
Hsiao (10) Patent No.: US 7,477,591 B2
(45) Date of Patent: Jan. 13, 2009

(54) DATA SLICER OF DYNAMICALLY ADJUSTING SLICE LEVEL

(75) Inventor: Yuan-Kun Hsiao, Taipei Hsien (TW)

(73) Assignee: Tian Holdings, LLC, Wilmington, DE (US)

( * ) Notice: Subject to any disclaimer, the term of this patent is extended or adjusted under 35 U.S.C. 154(b) by 655 days.

(21) Appl. No.: 10/709,024

(22) Filed: Apr. 7, 2004

(65) Prior Publication Data

US 2005/0018579 A1 Jan. 27, 2005

Related U.S. Application Data

(60) Provisional application No. 60/461,578, filed on Apr. 10, 2003.

(51) Int. Cl.
G11B 7/00 (2006.01)

(52) U.S. Cl. .............................. 369/124.15; 369/124.01

(58) Field of Classification Search ........................ None
See application file for complete search history.

(56) References Cited

U.S. PATENT DOCUMENTS

| | | | |
|---|---|---|---|
| 4,999,824 A * | 3/1991 | Fuji et al. ................ | 369/13.02 |
| 5,475,666 A | 12/1995 | Ito et al. | |
| 5,689,482 A | 11/1997 | Iida | |
| 6,088,307 A | 7/2000 | Fushimi | |
| 6,285,219 B1 | 9/2001 | Pauls | |
| 6,333,902 B1 | 12/2001 | Shim | |
| 6,345,023 B1 | 2/2002 | Fushimi et al. | |
| 6,587,417 B2 | 7/2003 | Okamoto | |
| 6,661,752 B2 | 12/2003 | Eom | |
| 6,754,147 B2 | 6/2004 | Hsu | |
| 6,765,861 B2 | 7/2004 | Van Vlerken | |
| 6,785,207 B2 | 8/2004 | Nishimura et al. | |
| 6,891,785 B2 | 5/2005 | Yamamoto et al. | |
| 6,956,800 B2 * | 10/2005 | Tanaka ...................... | 369/53.2 |
| 7,016,277 B2 | 3/2006 | Chou | |
| 7,039,380 B2 | 5/2006 | Jahene | |
| 7,046,598 B2 | 5/2006 | Eom | |
| 7,053,919 B2 | 5/2006 | Nagano | |
| 2002/0131347 A1 | 9/2002 | Raaymakers | |
| 2003/0043714 A1 | 3/2003 | Takeda | |
| 2003/0081531 A1 * | 5/2003 | Mashimo et al. ....... | 369/124.12 |
| 2003/0117915 A1 | 6/2003 | Minamino | |
| 2003/0179665 A1 | 9/2003 | Iwazawa et al. | |
| 2004/0057360 A1 | 3/2004 | Banno | |
| 2004/0141577 A1 | 7/2004 | Brunn | |
| 2004/0213119 A1 | 10/2004 | Van Vlerken et al. | |
| 2005/0073923 A1 | 4/2005 | Tobita | |

FOREIGN PATENT DOCUMENTS

| | | |
|---|---|---|
| CN | 1373474 A | 10/2002 |
| JP | 11-353686 | 12/1999 |
| TW | 509927 | 11/2002 |

* cited by examiner

*Primary Examiner*—Muhammad N. Edun
(74) *Attorney, Agent, or Firm*—Perkins Coie LLP (57) ABSTRACT

A data slicer capable of dynamically adjusting a slice level according to a wobble signal retrieved from a DVD-R/RW disc. The data slicer has a peak hold circuit for generating a first output signal according to positive peaks of the wobble signal, a bottom hold circuit for generating a second output signal according to negative peaks of the first output signal, a bias circuit for utilizing a bias voltage to raise voltage levels of the second output signal to generate the slice level, and a comparator for comparing the wobble signal with the slice level to generate corresponding square wave signal.

8 Claims, 10 Drawing Sheets

DATA SLICER OF DYNAMICALLY ADJUSTING SLICE LEVEL

BACKGROUND OF INVENTION

1. Field of the Invention

The invention relates to a slicer utilized in an optical disc drive, and more particularly, to a slicer capable of dynamically adjusting slice level according to a wobble signal read from a DVD-R/RW optical disc.

2. Description of the Prior Art

In present day information society, storage of large amounts of information has become a major problem. Of all types of storage medium, the optical disc is one of the most useful mediums because of its high storage capacity and small physical volume. However, as multimedia technology progresses increased storage requirements are required, and the storing capacity of a normal CD optical disc (650 MB) is becoming increasingly less satisfactory. Therefore, a new optical disc standard, the digital versatile disc (DVD), with increased storage capacity, has emerged. The physical size of a DVD is almost identical to that of a CD; however, the storage capacity of a DVD is much larger than that of a CD. However, because the CD-R and CD-RW discs can easily stores needed data, similarly, the standards of the DVD-R disc and the DVD-RW disc are created so that users can utilize DVD-R or DVD-RW discs much like the CD-R and CD-RW discs to store an increased amount of data.

Figure 1:
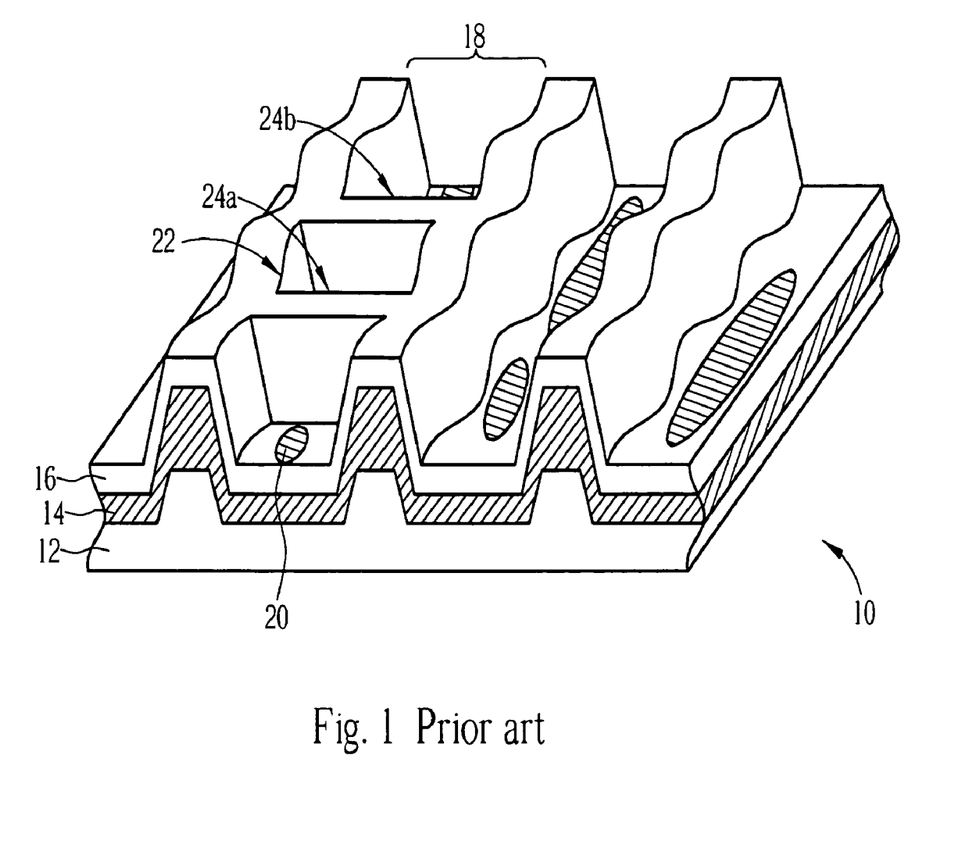
FIG. 1 is a schematic diagram of a DVD-RW multi-functional digital disc according to the prior art.

As done with the CD disc, a specific structure is installed on a DVD-RW multi-function digital disc for addressing stored data and consequently for easily accessing the data. Please refer to FIG. 1, which is a schematic diagram of a DVD-R/RW multi-function digital disc 10 according to the prior art. The DVD-R/RW multi-function digital disc 10 comprises a substrate 12, a reflective layer 14, and a protective layer 16. Furthermore, a plurality of grooves are set on the surface of the DVD-R/RW multi-function digital disc 10 such that a optical pick-up unit (OPU) output a write-in power according to a write-in ploy for writing a plurality recording marks 20 in the groove 18. Generally speaking, in order to smoothly store recording marks 20 in the correct position of the DVD-R/RW multi-function digital disc 10, the optical disc drive has to know the track information of DVD-R/RW multi-function digital disc 10. Therefore, the DVD-R/RW multi-function digital disc 10 has a wobble track 22 to store the track information. In other words, the optical disc drive can read a wobble signal from the wobble track and then decode the wobble signal to obtain needed track information.

Figure 2:
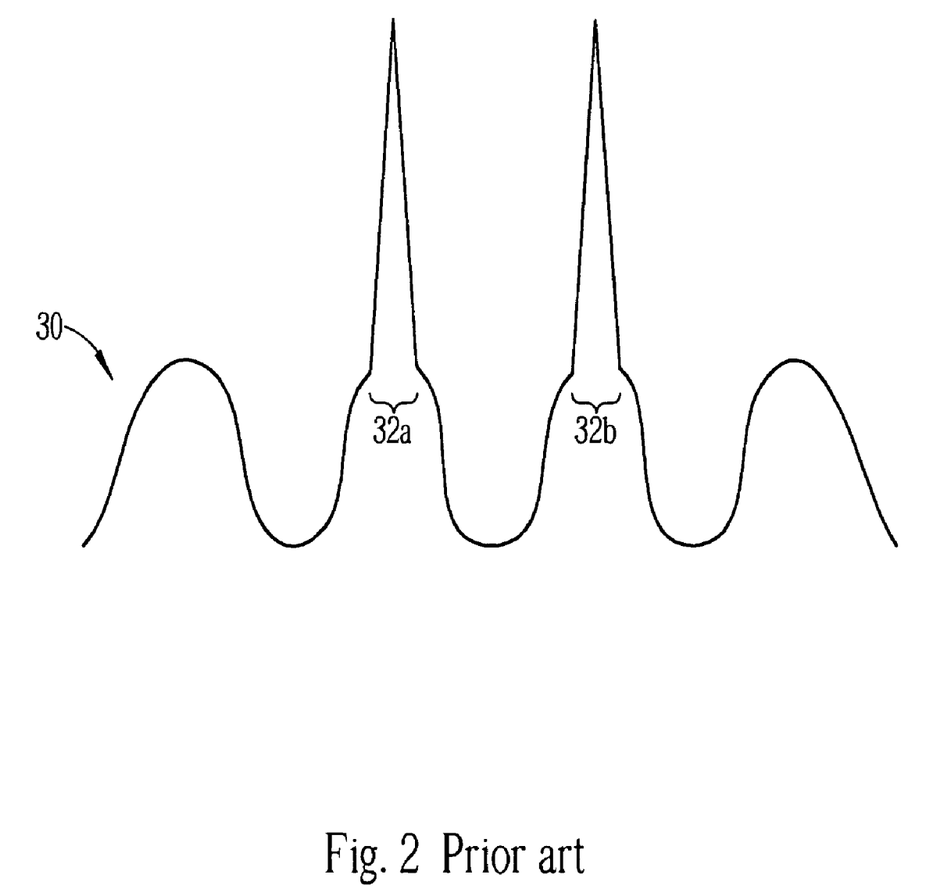
FIG. 2 is a diagram of a wobble signal generated by a wobble track shown in FIG. 1.

According to the prior art DVD-R standard, the DVD-R/RW multi-function digital disc 10 utilizes a plurality of land pre-pit (LPP) 24a, 24b for modulating the wobble signal to store the track information. Please refer to FIG. 2, which is a diagram of a wobble signal 30 generated by the wobble track 22 shown in FIG. 1. An optical pick-up unit reads the wobble track 22 to generate the wobble signal 30. When the optical pick-up unit moves to the LPP 24a, the optical pick-up unit is affected by the LPP 24a so that the optical pick-up unit suddenly generates a spike 32a. Similarly, when the optical pick-up unit moves to the following LPP 24b, the optical pick-up unit generates a spike 32b, too. Therefore, the LPPs 24a, 24b can be pre-installed on the DVD multi-function digital disc 10 for forming the wobble signal 30. In other words in the prior art, the DVD multi-function digital disc 10 utilizes different LPPs having different positions for driving the wobble signal 30 to generate spikes to store the track information. Therefore, the optical disc drive at last needs to detect the spikes 32a, 32b to determine stored data in the wobble signal. As known by those skilled in the art, the wobble signal 30 actually does not have the ideal waveform shown in FIG. 2. That is, signal amplitude of the wobble signal 30 changes, and different DVD multi-function digital discs 10 have different wobble signals 30. Therefore, when the optical disc drive utilize a data slicer detects the spikes of the wobble signal 30 through a fixed slice level, an error determination may occur so that the following decoding operation of the wobble signal 30 is affected.

SUMMARY OF INVENTION

It is therefore a primary objective of the claimed invention to provide a slicer capable of dynamically adjusting slice level according to a wobble signal read from an DVD-R/RW optical disc, to solve the above-mentioned problem.

According to an exemplary embodiment of the claimed invention, a device for slicing a spike signal, the device comprising: a peak hold circuit for receiving the spike signal, for holding positives peak voltages of the spike signal to generate a first output signal; a low-pass filter electrically connected to the peak hold circuit, the low pass filter for receiving the first output signal and for filtering the first output signal to generate a slice level signal; a bias circuit for providing a voltage to raise voltage level of a signal inputted into the bias circuit; and a comparator electrically connected to the low-pass filter, the comparator for comparing the spike signal with the slice level signal to slice the spike signal.

In addition, a device for slicing a spike signal, the device comprising: a limiter for receiving the spike signal and for limiting the spike signal within a voltage range to generate a first output signal; a peak hold circuit electrically connected to the limiter for receiving the first output signal and for holding the positive peak voltages of the first output signal to generate a second output signal; a low-pass filter electrically connected to the peak hold circuit for receiving the second output signal and for filtering the first output signal to generate a slice level signal; a bias circuit for raising a voltage level of a signal inputted into the bias circuit; and a comparator electrically connected to the low-pass filter, the comparator for comparing the spike signal with the slice level signal to slice the spike signal.

Further in addition, a device for slicing a spike signal, the device comprising: a peak hold circuit for receiving the spike signal and for holding the positive peak voltages of the spike signal to generate a first output signal; a bottom hold circuit electrically connected to the peak hold circuit, the bottom hold circuit for holding the negative peak voltages of the first output signal to generate a second output signal; a bias circuit for raising a voltage level of a signal inputted the bias circuit; and a comparator electrically connected to the bottom hold circuit, the comparator for comparing the spike signal with a slice level signal to slice the spike signal.

As well in addition, a method for slicing a spike signal, the method comprising: holding the positive peaks of the spike signal for generating a first output signal; low-pass filtering the first output signal for generating a second output signal; and comparing the spike signal with a slice level signal for slicing spike signal.

When accessing a DVD-R disc or a DVD-RW disc, the present invention slicer can dynamically adjust needed slice level according to the wobble signal formed from the disc so that a decoder can accurately decode the corresponding data of the wobble signal according to the output signal of the present invention slicer.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
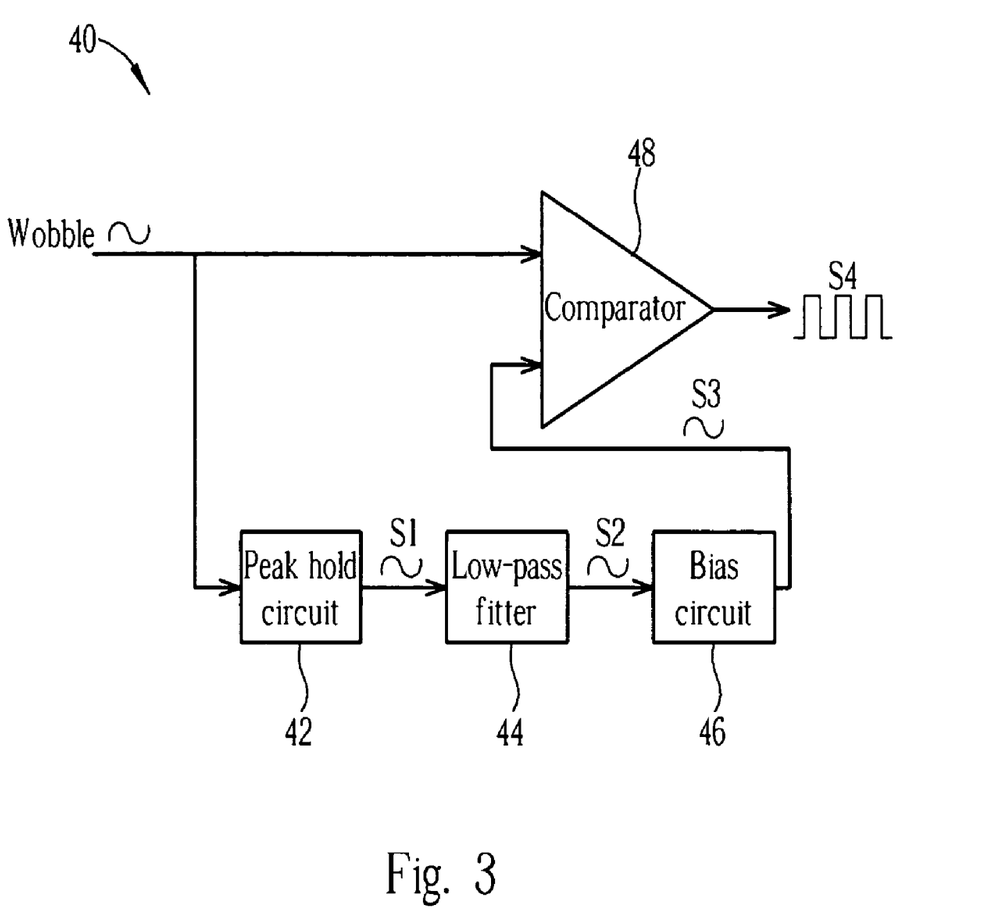
FIG. 3 is a block diagram of a first slicer utilized in a DVD-R/RW optical disc drive according to the present invention.
Figure 4:
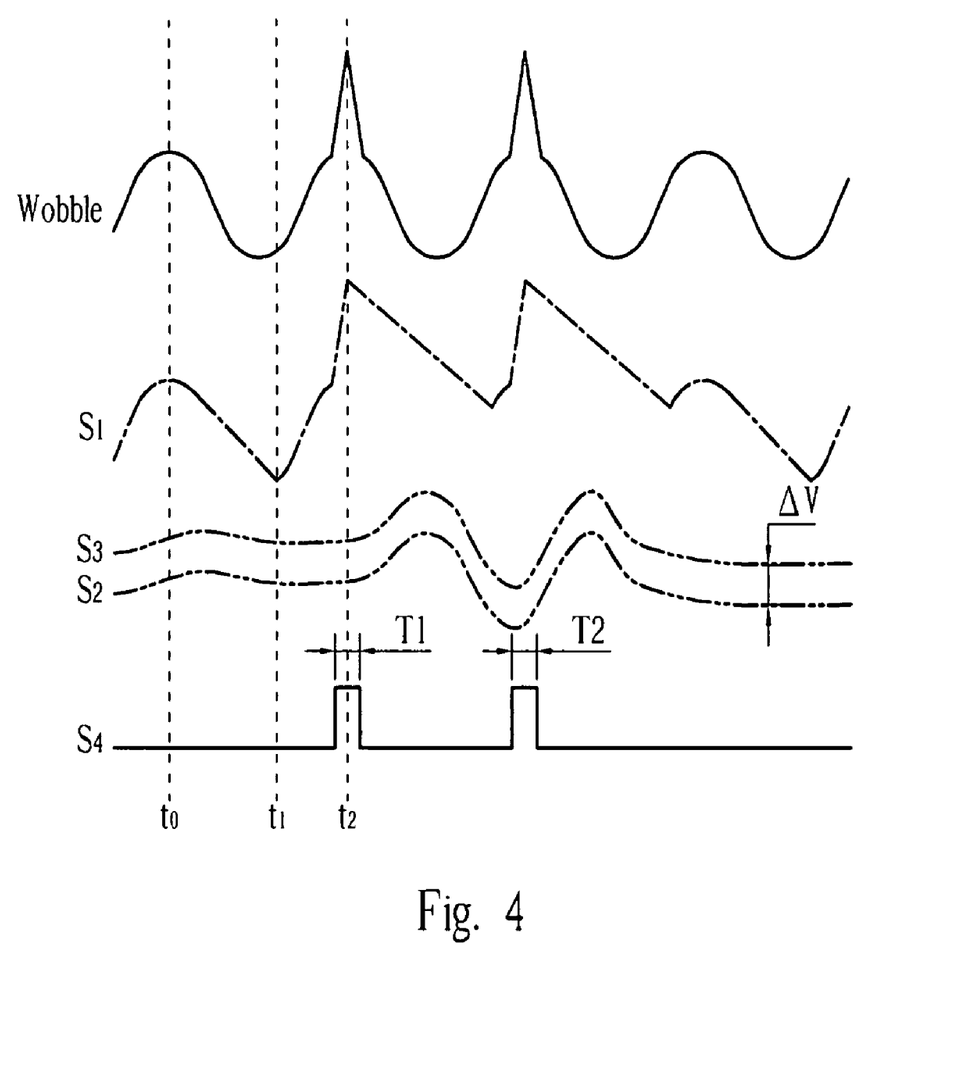
FIG. 4 is a first operational diagram of the slicer shown in FIG. 3.
Figure 5:
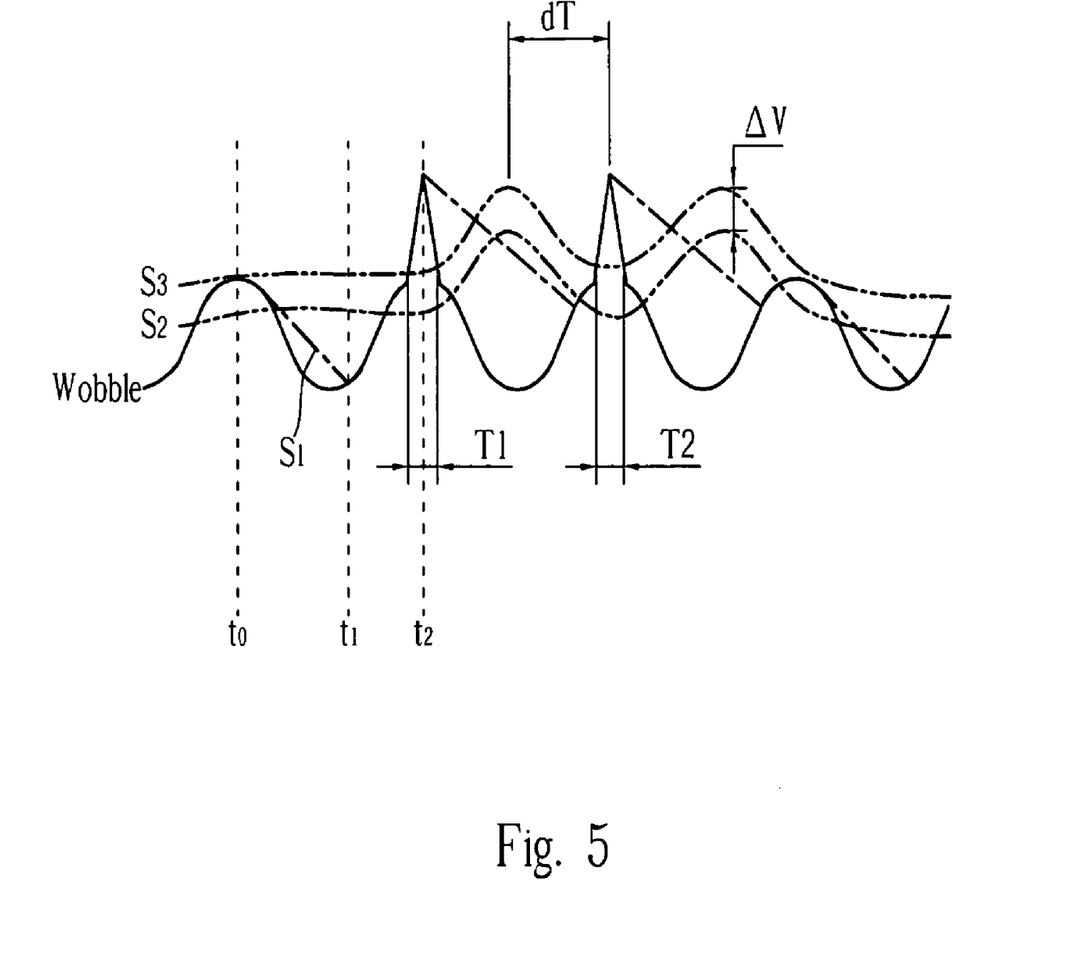
FIG. 5 is a second operational diagram of the slicer shown in FIG. 3.

Please refer to FIG. 3, FIG. 4, and FIG. 5. FIG. 3 is a block diagram of a first slicer 40 utilized in a DVD-R/RW optical disc drive according to the present invention. FIG. 4 is a first operational diagram of the slicer 40 in FIG. 3. FIG. 5 is a second operational diagram of the slicer 40 in FIG. 3. Please note that for clearly illustrating the technical characteristic of the slicer 40, FIG. 4 is used to show the waveform of each signal, and FIG. 5 illustrates voltage level relationships between each signal. This means that the waves of FIG. 5 are composed of the waves of FIG. 4. The slicer 40 comprises a peak hold circuit 42, a low-pass filter (LPF) 44, a bias circuit 46 and a comparator 48. The peak hold circuit 42 is utilized for holding positive peaks of the wobble signal Wobble. As shown in FIG. 4, at time t0, the voltage level of the wobble signal Wobble corresponds to the positive peak, and then the peak hold circuit 42 starts to discharge output signal S1 to reduce its voltage level after time t0. At time t1, voltage level of output signal S1 is equal to the voltage level to the wobble signal Wobble, therefore, after time t1, the wobble signal Wobble starts to drive the peak hold circuit 42 to make the voltage level of output signal S1 increases as the voltage level of the wobble signal Wobble. Similarly, at time t2, the voltage level of the wobble signal Wobble reaches its positive peak again, and then the peak hold circuit 42 discharge after t2 such that the voltage level of output signal S1 reduces. Therefore, according to similar operations, output signal S1, which is formed while the peak hold circuit 42 processes the wobble signal Wobble, has the waveform shown in FIG. 4.

And then, the output signal S1 is transferred to low-pass filter 44, which is used for filtering out high-frequency signal to smooth the waveform of the output signal S1. As shown in FIGS. 4, 5, spikes corresponding to high-frequency signal decays because of the low-pass filter 44. The output signal S2, which is outputted by the low-pass filter 44 according to the output signal S1, has the waveform as shown in FIG. 4. Then the output signal S2 is transferred to the bias circuit 46, which is used for raising the voltage level of the output signal S2. As shown in FIG. 4 and FIG. 5, the bias circuit 46 provides a voltage ΔV to the output signal S2 for generating needed output signal S3. That is, the purpose of the voltage ΔV is used for ensuring that the voltage level of the output signal S3 is higher than the corresponding voltage level of the wobble signal Wobble without spikes.

The output signal S3 generated by the bias circuit 46 is the slice level that the slicer 40 needs. Therefore, the comparator 48 compares the output signal S3 with the wobble signal Wobble to generate the output signal S4. As shown in FIG. 5, in the time interval T1 and T2, the voltage level of the wobble signal Wobble is higher than the voltage level of the output signal S3. Therefore, the comparator 48 outputs a high voltage level, apparently, the time interval T1 and T2 respectively corresponds to spikes so that a decoder can determine whether what the wobble signal Wobble stores is an even sync, odd sync, or data unit (logic value 1 or 0) according to the output signal S4 shown in FIG. 4.

Please note that the peak hold circuit 42 and the low-pass filter 44 causes a phase delay phenomenon of the output signal S3 when operating. As shown in FIG. 5, if the output signal S3 delays a time interval dT so that the wave part of the output signal S3, corresponding to a spike of the wobble signal Wobble, is compared with the next spike of the wobble signal Wobble. That is, when the comparator 48 generates the output signal S4 according to the phase-delayed output signal S3, the time interval, which the voltage level of the wobble signal Wobble is higher than the output signal S3, is apparently shortened because of the phase delay phenomenon. This also means that the original time interval T2 is shortened, such that the following decoder wrongly determines the time interval T2 of the output signal S4, which is generated by the noise. Therefore, in this embodiment, the peak hold circuit 42 has to be well controlled to cooperate with the low-pass filter 44 in order to prevent the above-mentioned phase-delay phenomenon of the slicer 40.

Because the bias circuit 46 provides a fixed bias voltage to adjust the voltage level of an input signal for generating the corresponding output signal, the waveform shape of the input signal does not differ from the shape of output signal. Therefore, the slicer 40 is not limited as the circuit structure as shown in FIG. 3. For example, the bias circuit 46 can be electrically connected between the peak hold circuit 42 and the low-pass filter 44, to firstly adjust the output signal of peak hold circuit 42 before the low-pass filter 44, or to firstly adjusting the wobble signal Wobble and then transfer the wobble signal Wobble after raising its voltage level to the following peak hold circuit 42 and the low-pass filter for processing. After the above-mentioned slicer circuit structure adjustments, the slicer can generate a slice level (the output signal S3) shown in FIGS. 4, 5.

Figure 6:
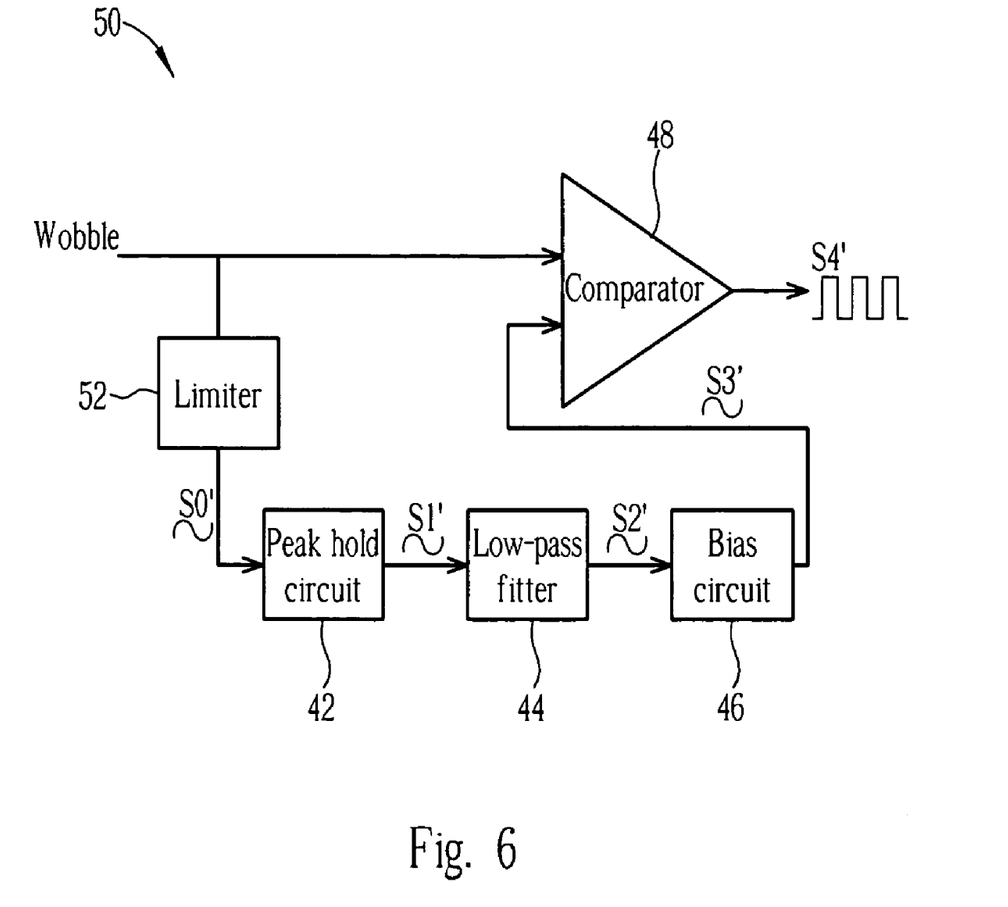
FIG. 6 is a block diagram of a second slicer utilized in a DVD-R/RW optical disc drive according to the present invention.
Figure 7:
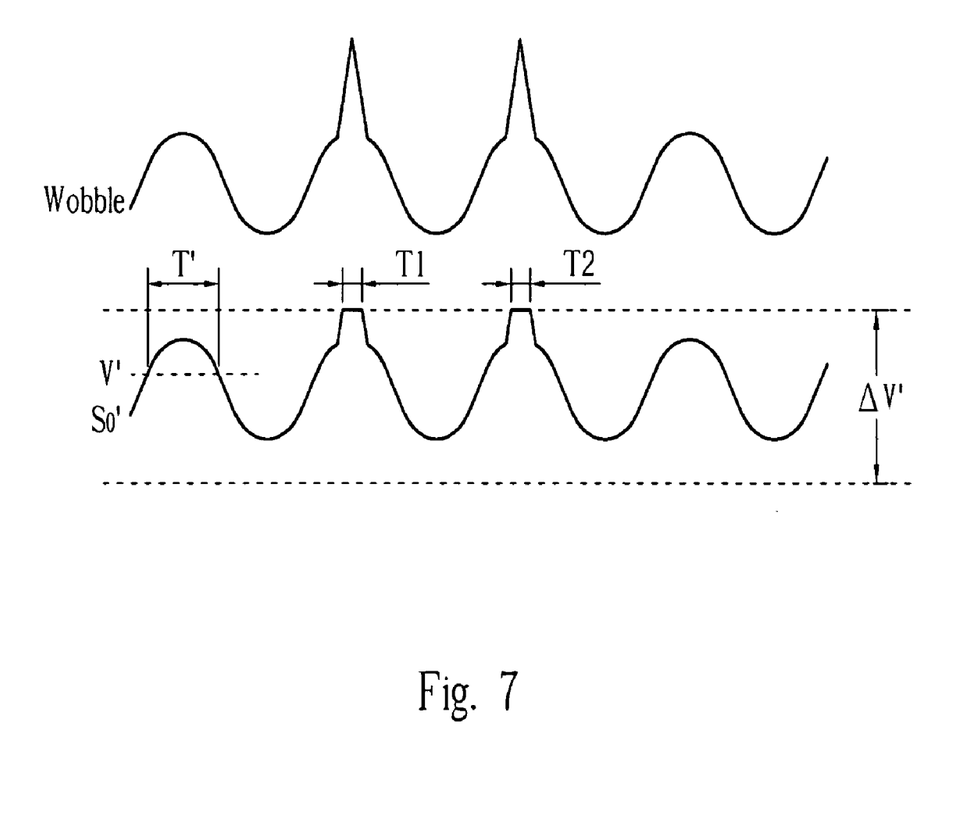
FIG. 7 is an operational diagram of a limiter shown shown in FIG. 6.

Please refer to FIG. 6 and FIG. 7. FIG. 6 is a block diagram of a second slicer 50 utilized in a DVD-R/RW optical disc drive according to the present invention. FIG. 7 is an operational diagram of a limiter shown in FIG. 6. The slicer 50 comprises: a limiter 52, a peak hold circuit 42, a low-pass filter 44, a bias circuit 46, and a comparator 48. The slicer 50 adds the limiter 52 to the slicer 40. The functions of the peak hold circuit 42, the low-pass filter 44, the bias circuit 46, and the comparator 48 have already been mentioned above and thus omitted here. A wobble signal Wobble is firstly inputted into the limiter 52, The limiter 52 is used for obtaining signals with a voltage range ΔV'. For example, diodes can be utilized to form the circuit of the limiter 52. As shown in FIG. 7, the spikes of the wobble signal Wobble is partially greater than the above voltage level of voltage range ΔV', therefore, in the time interval T1 and T2, the output signal S0' generated by the limiter 52 corresponds to the above voltage level of voltage range ΔV'. In this embodiment, the limiter 52 is used for reducing the impact of the wobble signal Wobble on the peak hold circuit 42 such that the waveform of the slice level is improved.

And then the output signal S0' is transferred to the peak hold circuit 42, and the peak hold circuit 42 outputs the output signal S1' according to the output signal S0'. Furthermore, the low-pass filter 44 generates the output signal S2' that has a smooth waveform according to the output signal S1'. At last, the bias circuit 46 utilizes a voltage for raising the voltage level of the output signal S2' to generate the output signal S3'. In this embodiment, the output signal S3' is used for a slice level; therefore, the comparator 48 compares the output signal S3' with the wobble signal Wobble for generating the output signal S4'. Therefore, a decoder can determine whether what the wobble signal Wobble stores is an even sync, an odd sync, or a data unit (logic value 1 or 0) according to the output signal S4'.

In addition, in this embodiment, the voltage range ΔV of the limiter 52 has to cover the voltage amplitude of the wobble signal Wobble except for the spike of the wobble signal Wobble. If the above voltage level of the voltage range ΔV is lower than the peak of the wobble signal Wobble, the output signal S4' of the slicer 50 includes unnecessary noise due to the low slice level. For example, in FIG. 7, if the above voltage level of the voltage range ΔV' is V', the output signal S4' corresponds to high voltage level in the time interval T', but the time interval does not correspond to the spike of the wobble signal Wobble, therefore, the decoder may wrongly decode the wobble signal Wobble according to the output signal S4'.

As mentioned above, the bias circuit 46 does not alter the shape of input signal, so the input signal and the output signal have the same waveforms shape. Therefore, the slicer 50 is not limited as the circuit structure as shown in FIG. 6, for example, the bias circuit 46 can be electrically connected between the limiter 52 and the peak hold circuit 42 or electrically connected between the peak hold circuit 42 and the low-pass filter 44. Furthermore, the bias circuit 46 can firstly adjust the wobble signal Wobble and then transfer the voltage-level-raised wobble signal Wobble to the following limiter 52, the peak hold circuit 42, and the low-pass filter 44 for processing. The above mentioned three circuit structures of the slicer can generate needed slice level.

Figure 8:
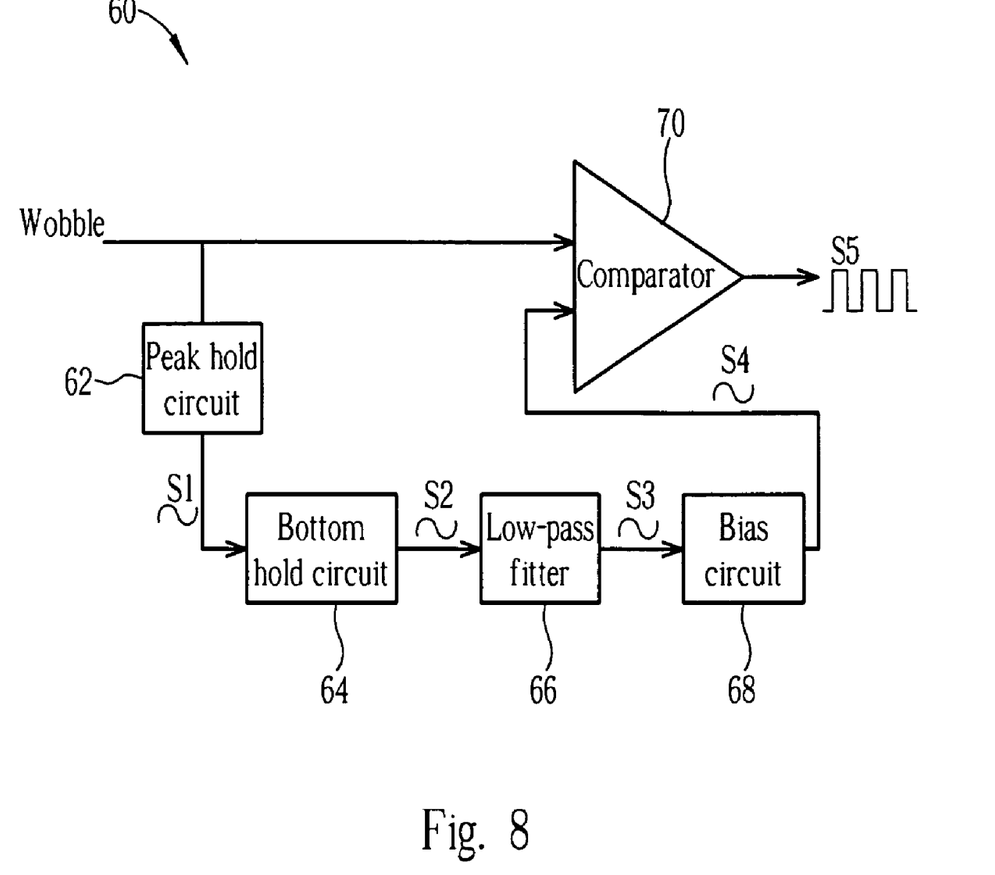
FIG. 8 is a block diagram of a third slicer utilized in a DVD-R/RW optical disc drive according to the present invention.
Figure 9:
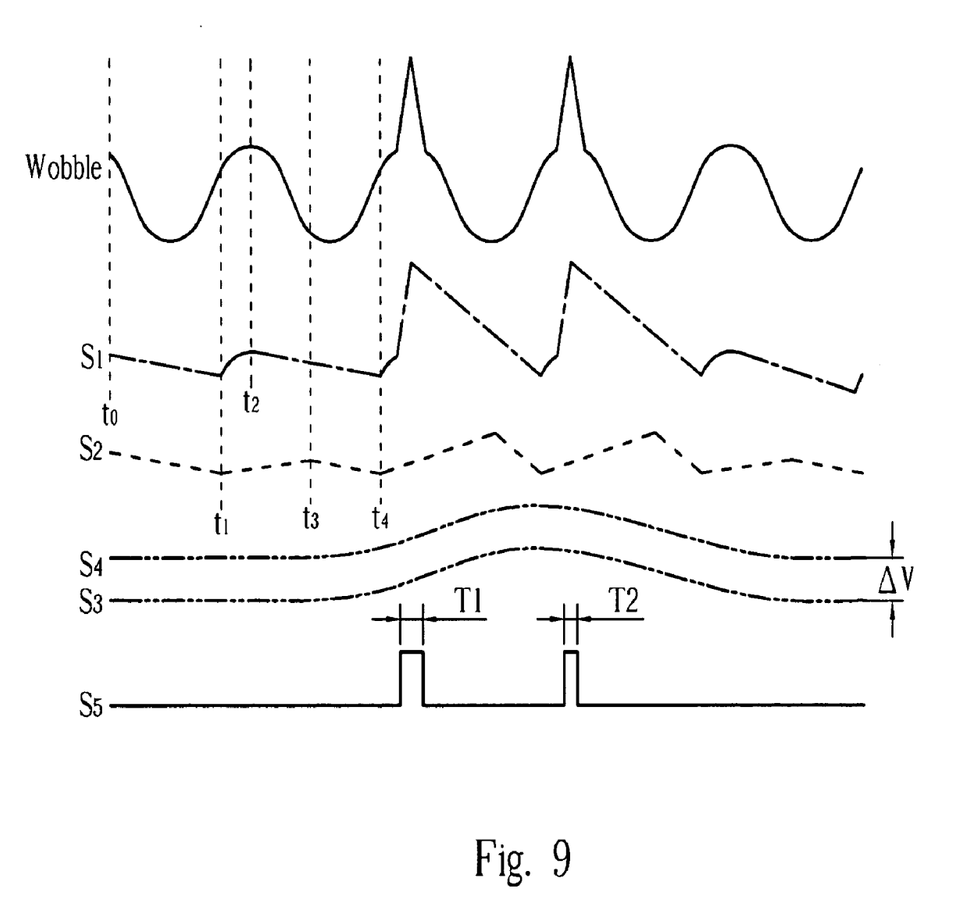
FIG. 9 is a first operational diagram of the slicer shown in FIG. 8.
Figure 10:
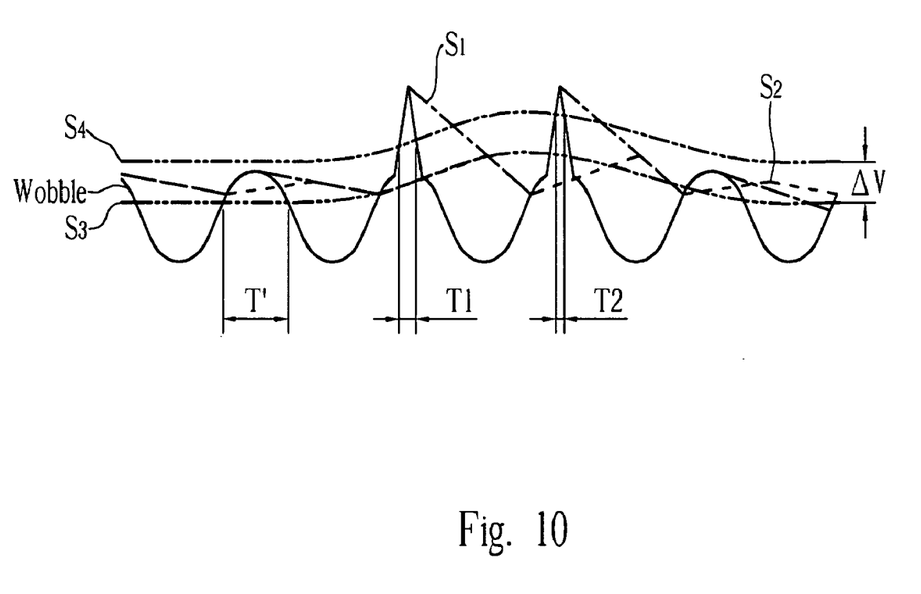
FIG. 10 is a second operational diagram of the slicer shown in FIG. 8.

FIG. 8 is a block diagram of a third slicer 60 utilized in a DVD-R/RW optical disc drive according to the present invention. FIG. 9 is a first operational diagram of the slicer 60 shown in FIG. 8. FIG. 10 is a second operational diagram of the slicer 60 shown in FIG. 8. Please note that for clearly illustrating the technical characteristic of the slicer 60, FIG. 9 is used to show the waveform of each signal and FIG. 10 illustrates voltage level relationship between each signal. This means that the waves shown in FIG. 10 are composed of waves shown in FIG. 9. The slicer 60 comprises a peak hold circuit 62, a bottom hold circuit 64, a low-pass filter 66, a bias circuit 68, and a comparator 70. The operation of the slicer 60 is illustrated as follows. Firstly, a wobble signal Wobble is inputted into the peak hold circuit 62, which is used for holding the positive peaks of the wobble signal Wobble. As shown in FIG. 9, at time t0 the voltage level of the wobble signal Wobble corresponds to its positive peak, and the peak hold circuit 62 starts to discharge and reduces the voltage level of the output signal S1. At time t1, the voltage level of the wobble signal Wobble is equal to the voltage level of the output signal S1. Therefore, after time t1, the wobble signal drives the peak hold circuit 62 so that the voltage level of the output signal S1 raises with the wobble signal Wobble. Similarly, at time t2, the voltage level of the wobble signal Wobble reaches its positive peak, and the peak hold circuit 62 discharges again after time t2 so that the voltage level of the output signal S1 reduces. Therefore, according to above-mentioned operation, the wobble signal Wobble processed by the peak hold circuit 64 has the waveform as shown in FIG. 9.

Next the peak hold circuit 64 transfers the output signal S1 to the bottom hold circuit 64, which is used for holding the negative peaks of the output signal S1. As shown in FIG. 9, at time t1 the voltage level of the output signal S1 corresponds to its negative peak. The bottom hold circuit 64 charges and raise the voltage level of the output signal S2 after time t1. At time t3, the voltage level of the output signal S2 is equal to the voltage level of the output signal S1. After time t3, the output signal S1 drives the bottom hold circuit 64 such that the voltage level of the output signal S2 decreases. Similarly, at time t4, the voltage level of the output signal S1 reaches its negative peak, and then the bottom hold circuit 64 starts to charge and raises the voltage level of the output signal S2. Therefore, according to the above operation, the output signal S2 processed by the bottom hold circuit 64 has the waveform as shown in FIG. 9. As shown in FIG. 9 and FIG. 10, the voltage level of the output signal S2 is lower than the voltage level of signals Wobble and S1 during a spike of the wobble signal Wobble. That is, in this embodiment, the bottom hold circuit 64 can prevent an impulse of the wobble signal Wobble from impacting on the slice level.

Then the bottom hold circuit 64 transfers the output signal S2 to the low-pass filter 66 for smoothing. The output signal S3 generated by the low-pass filter 44, according to the output signal S2, has the waveform shown in FIG. 9. As shown in FIG. 10 at time T', the voltage level is higher than the output signal S3, when the wobble signal Wobble is not in the instance of spiking. That said, if the output signal S3 is directly used by the slicer 60, the output signal S5 of the slicer 60 would includes unnecessary noise, because the voltage level of the output signal S3 is too low. Therefore, in this embodiment, the bias circuit 68 is used to raise the voltage level of signal S3. In other words, the output signal S3 is further transferred to the bias circuit 68. As shown in FIG. 9 and FIG. 10, the bias circuit 68 provides a voltage ΔV to the output signal S3 for generating needed output signal S4. This also means that the voltage ΔV is used for ensuring that the output signal S4 is higher than the wobble signal Wobble except for the spikes of the wobble signal Wobble.

In this embodiment, the output signal S4 is used as a slice level, therefore, the bias circuit 68 transfers the output signal S4 to the comparator 70. At last the comparator 70 compares the output signal S4 with the wobble signal Wobble for generating the output signal S5. As shown in FIG. 9 and FIG. 10, at the time intervals T1 and T2, the voltage level of the wobble signal Wobble is higher than the voltage level of the output signal S5. Therefore, the comparator 70 outputs a high voltage level, apparently, the time interval T1 and T2 respectively corresponds to spikes such that the a decoder can determine whether what the wobble signal Wobble stores is an even sync, an odd sync, or a data unit (logic value 1 or 0) according to the output signal S5 shown in FIG. 9.

In this embodiment, the low-pass filter 66 is mainly used for reducing the impact of the original noise of the wobble signal Wobble on the needed slice level. This also means that the low-pass filter 66 can reduce the interference that the noise affects the output signal S5 of the slicer 60 and further prevents the following decoder from giving erroneous results due to a bad slice level. However, the installation of low-pass filter 66 in the slicer 60 is not completely necessary; in otherwords, the output signal S2 can be directly transferred to the bias circuit 68. Meanwhile, the bias circuit 68 has to provide appropriate voltage ΔV to raise the voltage level of the output signal S2 for preventing the output signal S5 from including unnecessary noise because the voltage level of the output signal S4 is too low. In summary, the slicer 60 can utilize voltage-level-raised output signal S2 to accurately detect the spikes of the wobble signal Wobble.

As mentioned above, the bias circuit 68 does not make the output signal and the input signal respectively correspond to different waveform. Therefore, the slicer 60 is not only limited to the circuit structure shown in FIG. 8. For example, the bias circuit 68 can be electrically connected between the peak hold circuit 42 and the bottom hold circuit 64, or electrically connected between the peak hold circuit 64 and the low-pass filter 66. Furthermore, the bias circuit 68 can firstly adjust the wobble signal Wobble and then transfer the voltage-level-raised wobble signal Wobble to the following peak hold circuit 62, the bottom hold circuit 64, and the low-pass filter 66 for processing. The above-mentioned slicers can generate needed slice level (output signal S4).

To sum up, the slicer according to the present invention mainly utilizes a peak hold circuit to trace changes of the voltage level of the wobble signal and a low-pass filter and a bias circuit to generate needed slice level. Furthermore, the slicer can utilize a bottom hold circuit and a low-pass filter to generate needed slice level instead of utilizing the bias circuit. In other words, when accessing a DVD-R disc or a DVD-RW disc, the present invention slicer can dynamically adjust needed slice level according to the wobble signal formed from the disc so that a decoder can accurately decode the data corresponding to the wobble signal according to the output signal of the present invention slicer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device for slicing a spike signal, the device comprising:
   a limiter for receiving the spike signal and for limiting the spike signal to be within a voltage range to generate a first output signal;
   a peak hold circuit electrically connected to the limiter for receiving the first output signal and for holding the positive peak voltages of the first output signal to generate a second output signal;
   a low-pass filter electrically connected to the peak hold circuit for receiving the second output signal and for filtering the second output signal to generate a slice level signal;
   a bias circuit for raising a voltage level of the slice signal to produce a biased sliced signal; and
   a comparator electrically connected to the bias circuit, the comparator for comparing the spike signal with the biased slice level signal to slice the spike signal.

2. The device of claim 1 wherein the voltage range has an upper limit less than the maximum voltage of the spike signal.

3. A device for slicing a spike signal, the device comprising:
   a bias circuit for raising a voltage level of the spike signal and generating a biased spike signal;
   a limiter for receiving the biased spike signal and for limiting the biased spike signal to be within a voltage range to generate a first output signal;
   a peak hold circuit electrically connected to the limiter for receiving the first output signal and for holding the positive peak voltages of the first output signal to generate a second output signal;
   a low-pass filter electrically connected to the peak hold circuit for receiving the second output signal and for filtering the second output signal to generate a slice level signal; and
   a comparator electrically connected to the low-pass filter, the comparator for comparing the spike signal with the slice level signal to slice the spike signal.

4. The device of claim 3 wherein the voltage range has an upper limit less than the maximum voltage of the spike signal.

5. A device for slicing a spike signal, the device comprising:
   a limiter for receiving the spike signal and for limiting the spike signal to be within a voltage range to generate a first output signal;
   a bias circuit for raising a voltage level of the first output signal for generating a biased first output signal;
   a peak hold circuit electrically connected to the bias circuit for receiving the biased first output signal and for holding the positive peak voltages of the biased first output signal to generate a second output signal;
   a low-pass filter electrically connected to the peak hold circuit for receiving the second output signal and for filtering the second output signal to generate a slice level signal; and
   a comparator electrically connected to the low-pass filter, the comparator for comparing the spike signal with the slice level signal to slice the spike signal.

6. The device of claim 5 wherein the voltage range has an upper limit less than the maximum voltage of the spike signal.

7. A device for slicing a spike signal, the device comprising:
   a limiter for receiving the spike signal and for limiting the spike signal to be within a voltage range to generate a first output signal;
   a peak hold circuit electrically connected to the limiter for receiving the first output signal and for holding the positive peak voltages of the first output signal to generate a second output signal;
   a bias circuit for raising a voltage level of the second output signal to generate a biased second output signal;
   a low-pass filter electrically connected to the bias circuit for receiving the biased second output signal and for filtering the biased second output signal to generate a slice level signal; and
   a comparator electrically connected to the low-pass filter, the comparator for comparing the spike signal with the slice level signal to slice the spike signal.

8. The device of claim 7 wherein the voltage range has an upper limit less than the maximum voltage of the spike signal.

* * * * *

UNITED STATES PATENT AND TRADEMARK OFFICE
CERTIFICATE OF CORRECTION

PATENT NO.       : 7,477,591 B2                                              Page 1 of 1
APPLICATION NO.  : 10/709024
DATED            : January 13, 2009
INVENTOR(S)      : Yuan-Kun Hsiao It is certified that error appears in the above-identified patent and that said Letters Patent is hereby corrected as shown below:

In column 4, line 64, delete the comma and insert a period, therefor.

Signed and Sealed this

Seventeenth Day of March, 2009

JOHN DOLL
*Acting Director of the United States Patent and Trademark Office*